United States Patent
Grimes et al.

(10) Patent No.: US 7,289,925 B2
(45) Date of Patent: Oct. 30, 2007

(54) SYSTEMS AND METHODS FOR ASSESSING TIMING OF PCI SIGNALS

(75) Inventors: Gordon Keith Grimes, Colorado Springs, CO (US); William J. Schmitz, Monument, CO (US); Gregory William Achilles, Colorado Springs, CO (US)

(73) Assignee: LSI Corporation, Milpitas, CA (US)

( * ) Notice: Subject to any disclaimer, the term of this patent is extended or adjusted under 35 U.S.C. 154(b) by 311 days.

(21) Appl. No.: 10/743,957

(22) Filed: Dec. 23, 2003

(65) Prior Publication Data
US 2005/0138490 A1 Jun. 23, 2005

(51) Int. Cl.
*G01R 27/28* (2006.01)
(52) U.S. Cl. ..................................... 702/117
(58) Field of Classification Search .............. 702/117, 702/120, 124, 125, 66; 714/56, 55; 710/313, 710/105; 713/600
See application file for complete search history.

(56) References Cited

U.S. PATENT DOCUMENTS
5,778,194 A * 7/1998 McCombs ................. 713/600
6,516,366 B1 * 2/2003 Gates et al. ............... 710/105

OTHER PUBLICATIONS

PCI Express Development Solutions Catalog, by Catalyst Enterprises, Inc., Copyright 2003, 16 pages.

* cited by examiner

*Primary Examiner*—John Barlow
*Assistant Examiner*—Aditya Bhat
(74) *Attorney, Agent, or Firm*—Duft Bornsen & Fishman, LLP

(57) ABSTRACT

Methods and systems assess timing of PCI signals. A test mode is initiated within a host adapter board. A clock signal is generated for the host adapter board. PCI signals are generated within the host adapter board. One or more PCI signal lines of the host adapter board are electronically selected; and timing (e.g., slew rate and/or clock-to-signal valid) of the one or more PCI signal lines is assessed.

19 Claims, 5 Drawing Sheets

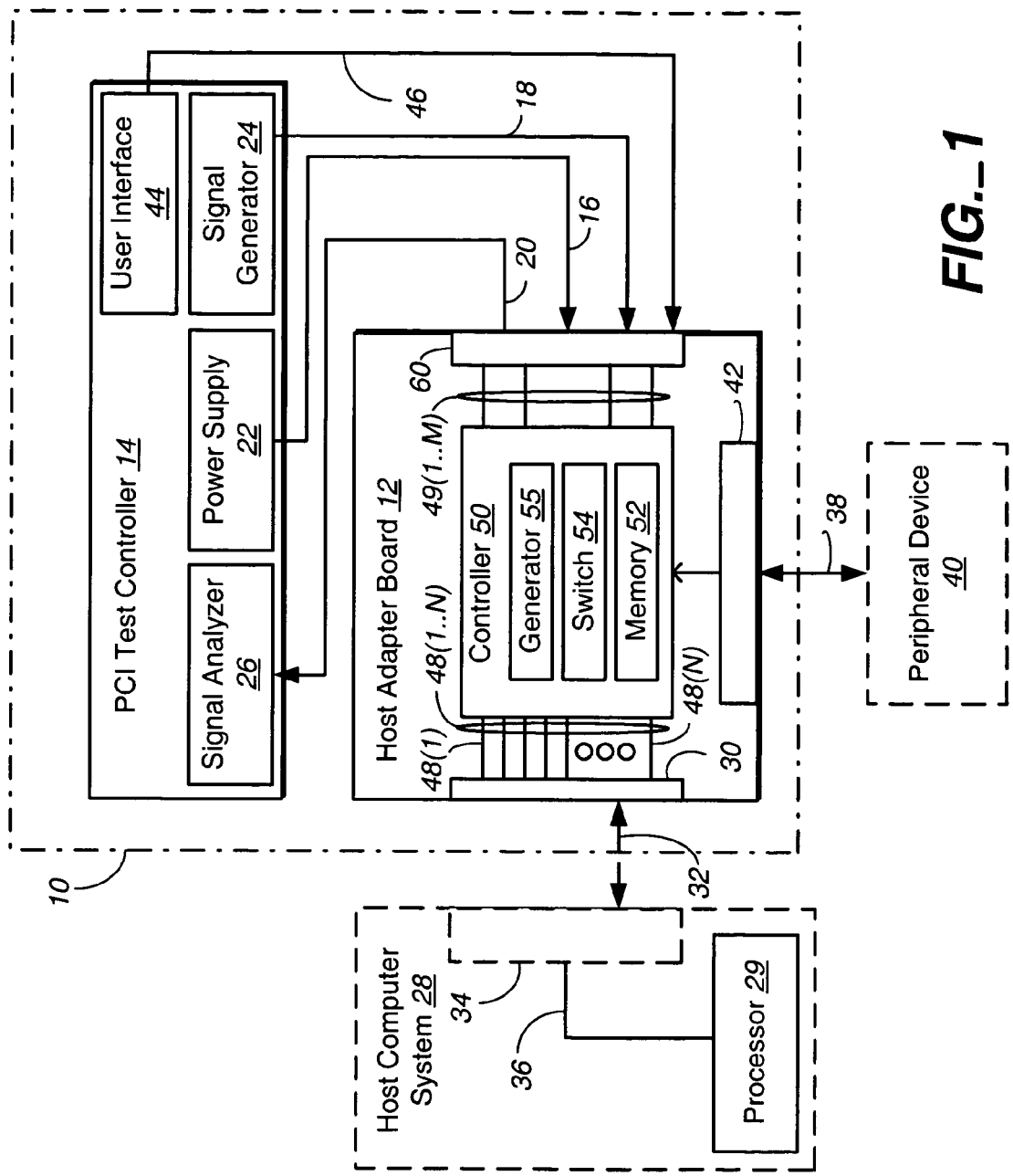
FIG._1

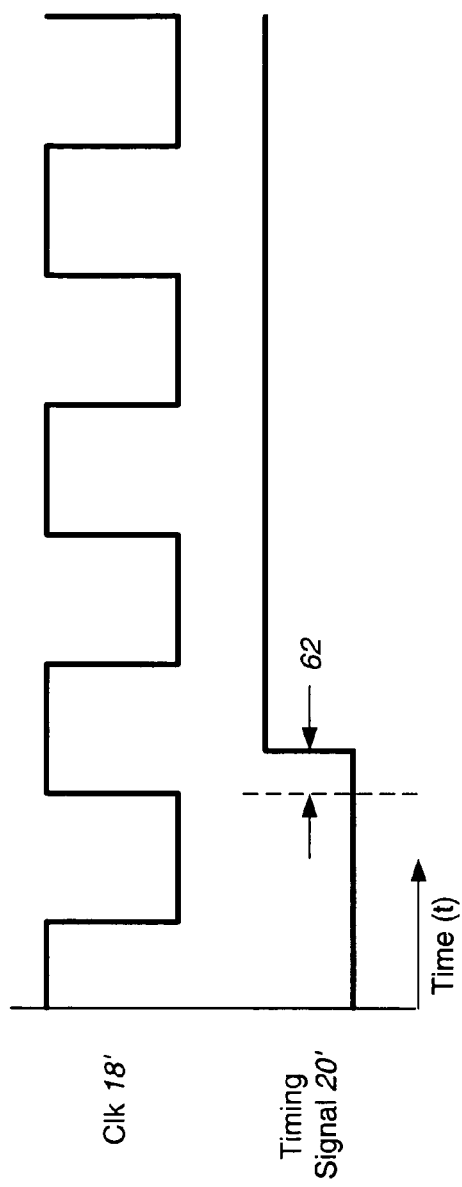
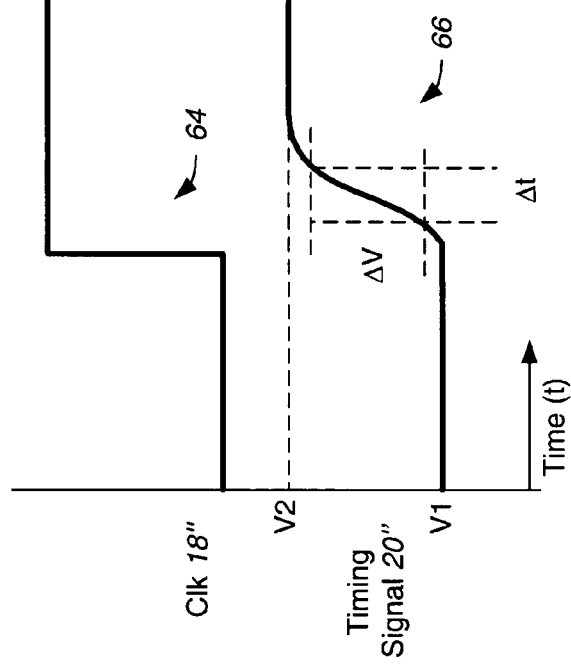
FIG._2A
FIG._2B

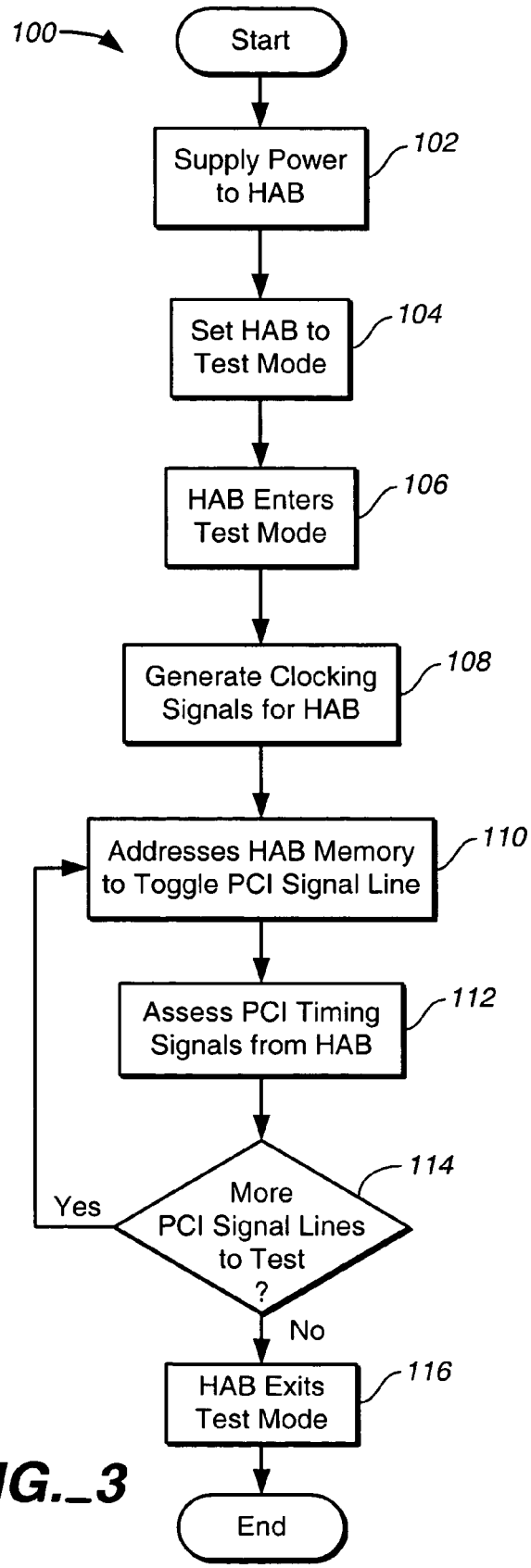
FIG._3

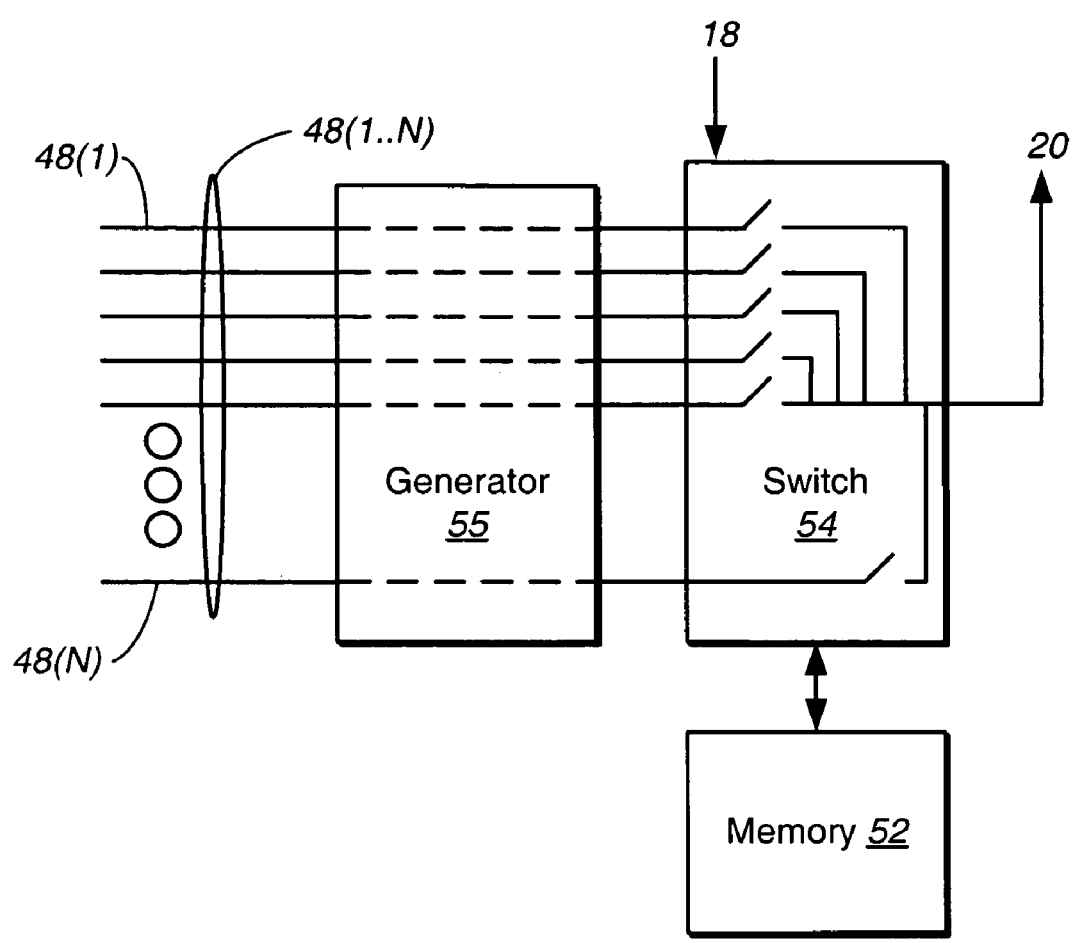
FIG._4

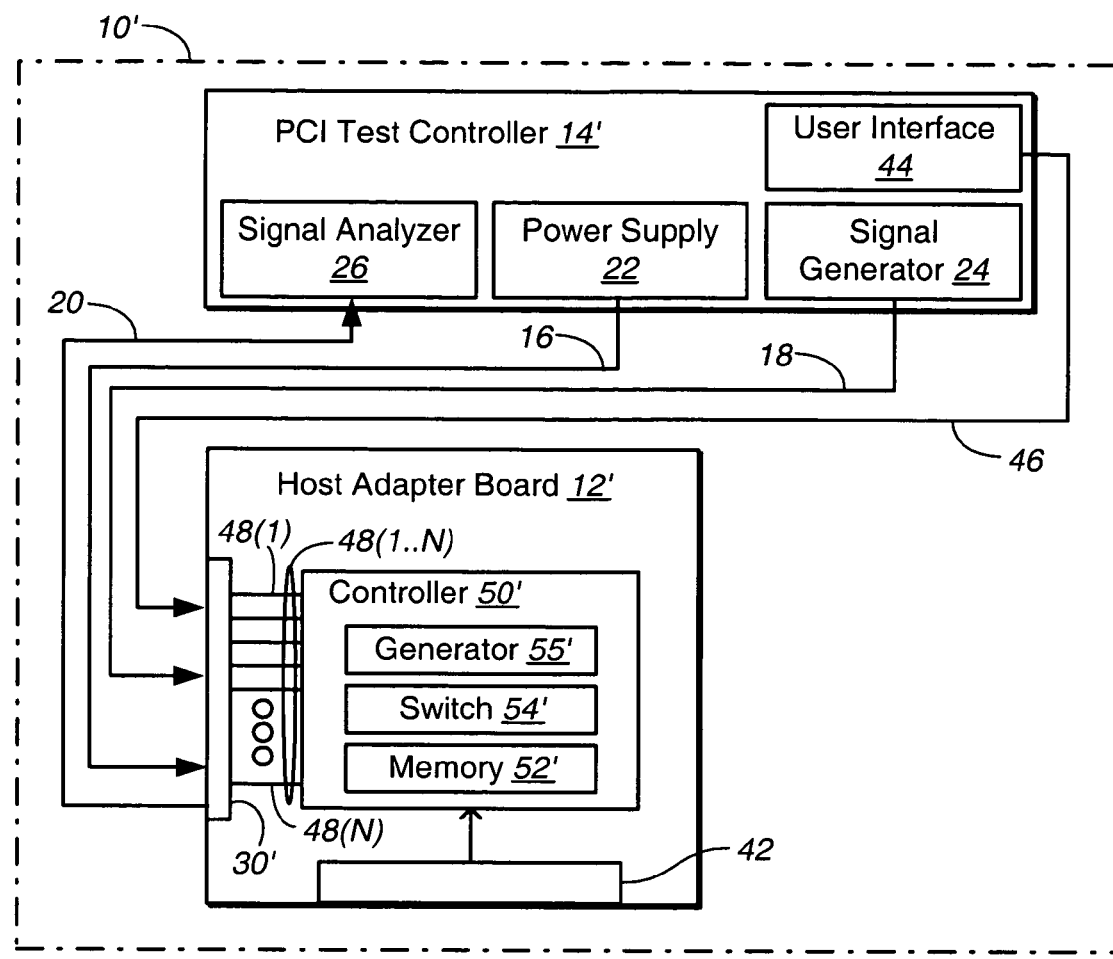
FIG._5

SYSTEMS AND METHODS FOR ASSESSING TIMING OF PCI SIGNALS

BACKGROUND

A host adapter board ("HAB") plugs into a host computer system to provide added functionality to the computer system. For example, the HAB facilitates communication between a peripheral component interconnect ("PCI") bus of the host computer system and a peripheral device (e.g., a storage subsystem, a network communication medium, etc.). The HAB often includes one or more components that provide the interface to the PCI bus and one or more components (e.g., an I/O controller) that provide interfacing to the peripheral device.

The PCI bus standards define certain PCI signal timing specifications. The PCI bus signal standards may be found, for example, at http://www.pcisig.com/specifications. Among the signalling standards specified therein are slew rate and clock-to-signal-valid delay. "Slew rate" defines a maximum rate of change in an output signal, for example four volts per nanosecond within a defined operating voltage range. "Clock-to-signal-valid" delay defines the time (e.g., five nanoseconds) between an initial clock signal and a ready state, which can be used to initiate data transfer to the HAB. To function properly, the HAB must process PCI signals from the bus within these PCI timing specifications.

To ensure that the timing of PCI signals in the HAB conform to PCI timing specifications, the HAB is tested one PCI signal at a time. As presently practiced in the art, this testing occurs through use of software utilities of a computer host connected to the HAB through the PCI bus; the software utilities serve to toggle PCI lines to the HAB while an engineer measures, for example, slew rate and clock-to-signal-valid delay. It is not however always possible to check each PCI signal since, currently, (a) the PCI signal under test must be isolated from the PCI bus in order to be measured and yet (b) certain connections are required so that the PCI bus functions properly. Accordingly, when isolated from the PCI bus, certain PCI signals are not configurable on the bus; they cannot therefore be toggled through the software utilities.

One solution to the foregoing problem is to "jumper" pins of the HAB so that all pins connect to the PCI bus during measurement; the software utilities are then operable to verify compliance with PCI timing specifications. Unfortunately, to jumper all PCI signals requires either (a) hardware modification to the HAB or (b) temporary wiring to PCI connectors or PCI traces within the HAB, which can create other problems, such as increased signal delay or noise, or disconnected signal lines.

SUMMARY

In one embodiment, a method assesses timing of PCI signals. A test mode is initiated within a host adapter board. A clock signal is generated for the host adapter board. PCI signals are generated within the host adapter board. One or more PCI signal lines of the host adapter board are electronically selected; and timing (e.g., slew rate and/or clock-to-signal valid) of the one or more PCI signal lines is assessed.

In another embodiment, a system assesses timing of PCI signals. A host adapter board responds to a test mode initialization to generate PCI signals within the host adapter board. The host adapter board has internal memory that stores addresses for PCI signal lines of the host adapter board. The host adapter board is adapted to receive an external clock signal and is configured to select one or more of the PCI signal lines, based on the addresses, for output from host adapter board. A PCI test controller assesses PCI signals from the output and relative to the clock signal.

In another embodiment, a system assesses timing of PCI signals, including: means for initiating a test mode within a host adapter board; means for generating a clock signal for the host adapter board; means for generating PCI signals within the host adapter board; means for electronically selecting one or more PCI signal lines of the host adapter board; and means for assessing timing (e.g., slew rate and/or clock-to-signal valid) of the one or more PCI signals from the PCI signal lines.

BRIEF DESCRIPTION OF THE FIGURES

FIG. 1 is a block schematic diagram illustrating one system that assesses timing of PCI signals;

FIG. 2A and FIG. 2B show exemplary timing signals generated by the system of FIG. 1;

FIG. 3 is a flowchart of one process for assessing timing of PCI signals;

FIG. 4 functionally illustrates operation of the controller of FIG. 1; and

FIG. 5 is a block schematic diagram illustrating one system that assesses timing of PCI signals.

DETAILED DESCRIPTION OF THE FIGURES

FIG. 1 illustrates a system 10 that assesses timing of PCI signals. System 10 has a host adapter board (HAB) 12 and a PCI test controller 14. In operation, PCI test controller 14 supplies power 16 and clock signal 18 to HAB 12; it then measures timing signal 20 from HAB so as to assess timing of PCI signals, as described below. Within PCI test controller 14, a power supply 22 provides power 16 to HAB 12, a signal generator 24 generates clock signal 18 applied to HAB 12, and a signal analyzer 26 assesses timing signal 20 so as to determine, for example, slew rate and clock-to-signal-valid delay.

For illustrative purposes, FIG. 1 also shows a host computer system 28. In the prior art, host computer system 12 was utilized in the assessment of PCI signal timing associted with HAB 12; however it is not necessary with system 10. In particular, HAB 12 has a PCI connector 30 that mates (indiciated by arrow 32) with a PCI connector 34 of host computer system 12 to connect HAB 12 to a PCI bus 36 of host computer system 28; PCI bus 36 then facilitates communications between an internal processor 29 of host computer system 28 and HAB 12, for example. Once connected to host computer 28, host adapter board 12 then in turn operates, for example, to communicate (indicated by arrow 38) between host computer system 28 and a peripheral device 40 (e.g., a hard drive); a protocol of communication 38 is for example SCSI. A separate connector 42 typically facilitates connection betweed HAB 12 and peripheral device 40.

PCI test controller 14 includes a user interface 44, which connects to HAB 12 through a signal line 46. User interface 44 and signal line 46 are used to initiate a "test mode" of HAB 12. When HAB 12 is in the test mode, internal circuitry of HAB 12 cycles through a series of addresses to toggle PCI signal lines 48(1 . . . N) of HAB 12, to generate timing signal 20. PCI signal lines 48(1 . . . N) connect with connector 30 and include N separate signal lines corresponding to the bit-width (e.g., 128-bits) of PCI bus 36. In one embodiment, the internal circuitry of HAB 12 includes a controller 50 with a memory 52, a switch 54 and a generator 55. Controller 50 is for example an integrated circuit of HAB 12, such as an I/O controller operable to facilitate communications with peripheral device 40. Memory 52 is for example random access memory (RAM) of controller 50, and operates to store PCI signal addresses used to toggle PCI signal lines 48(1 . . . N). Switch 54 is for example a mechanism that connects any one of PCI signal lines 48(1 . . . N) to timing signal 20, as currently addressed by the PCI addresses within memory 52. Generator 55 is operable to generate PCI signals for HAB 12 in place of PCI control signals normally generated by host computer system 28 when communicating with HAB 12 over PCI bus 36.

Memory 52, switch 54 and generator 55 need not be co-existing within a controller for peripheral device 40; they may instead be an integrated circuit of HAB 12 that is separate from control of peripheral device 40. Alternatively, they may be separate components or separate integrated circuits of HAB 12, as a matter of design choice. Other configurations of the internal circuitry 50, 52, 54, 55 are also possible to provide similar function without departing from the scope hereof.

In one embodiment, HAB 12 has a separate connector 60 that connects to signal lines 18, 20, 46 and power 16 of PCI test controller 14. Signal lines 18, 20, 46 and power 16 in turn couple with controller 50 through one or more signal and power lines 49(1 . . . M), where M is an integer defined by the particular design of controller 50 and/or by other circuitry of HAB 12. Upon reading and fully appreciating this disclosure, it should however be apparent that connection between PCI test controller 14 and HAB 12 may occur in different ways such that connector 60 is not required. For example, PCI test controller 14 may represent separate devices cooperating together. In one example, an oscilloscope (or logic analyzer) operates as signal analyzer 26 and user interface 44; a jumper between the oscilloscope (or logic analyzer) and a line 49 of HAB 12 can thus be used to initiate the test mode of HAB 12, as described below. In another example, a separate power supply 22 supplies power 16 to HAB 12 and a separate signal generator 24 supplies clock signal 18 to HAB 12.

FIG. 2A and FIG. 2B show exemplary timing signals generated by system 10. In FIG. 2A, clock signal 18' generated by signal generator 24 has a constant frequency, as shown. For each PCI signal line 48(1 . . . N), timing signal 20' is generated and processed, by signal analyzer 26, to assess clock-to-valid-signal delay 62. In FIG. 2B, clock signals 18" generated by signal generator 24 includes a step function 64, as shown. For each PCI signal line 48(1 . . . N), timing signal 20" is generated and processed, by signal analyzer 26, to assess slew rate 66, representing a maximum rate of change ΔV in output by the PCI signal, over a time period Δt (between a voltage range V1 to V2) when the input (step function 64) is large. Slew rate 66 is for example indicative of a transient response of op-amps within controller 50, FIG. 1.

FIG. 3 is a flowchart of one process 100 for assessing timing of PCI signals, as illustrated by the examples of FIG. 2A and FIG. 2B. Process 100 is for example implemented by PCI test controller 14 and HAB 12, FIG. 1. In step 102, power is supplied to the HAB. In one example of step 102, power supply 22 turns on and supplies power 16 to HAB 12. In step 104, the HAB is set to a test mode. In one example of step 104, a user interacts with user interface 44 to set HAB 12 to the test mode through signal line 46. In another example of step 104, a jumper is connected to HAB 12 to initiate the test mode.

In step 106, the HAB responds to step 104 and enters its test mode. Once in the test mode, generator 55 generates PCI signals to simulate PCI signals of PCI bus 36. Entering the test mode of step 104 may further disable HAB 12 from communication with a host computer, e.g., computer 28, FIG. 1, if still connected to host computer 28.

In step 108, a clocking signal is generated for the HAB. In one example of step 108, signal generator 24 generates clock signal 18' of FIG. 2A as input to controller 50. In another example of step 108, signal generator generates signal 18" of FIG. 2B as input to controller 50. Simultaneous with input of the clock signal to the HAB, generator 55 simulates PCI signals so that a timing signal (e.g., timing signal 20) is representative of operable PCI signals of HAB 12.

In step 110, the HAB responds to the clocking signal of step 108 to initiate assessment of a particular PCI signal. In one example of step 110, controller 50 selects one of a series of memory addresses within memory 52 to toggle a particular PCI signal line, through switch 54, from low to high, such that the PCI signal is enabled; timing signal 20 is then generated for this PCI signal line as in step 112, described below.

In particular, in step 112, HAB 12 responds to the clock signal selected in step 108 to assess PCI timing signals from the current PCI signal line. In one example of step 112, HAB generates timing signal 20' of FIG. 2A, and signal analyzer 26 determines clock-to-signal valid 62 for the selected PCI signal line 48. In another example of step 112, HAB generates timing signal 20" of FIG. 2B, and signal analyzer 26 determines slew rate 66 for the current PCI signal line 48.

Step 114 is a decision. If additional PCI signal lines are to be tested, steps 110, 112 repeat, as shown. When repeated, another one of the PCI signal lines is addressed in step 110 (e.g., another PCI signal line 48 is addressed through memory 52) and then timing data associated with the new PCI signal line is assessed in step 112. If no additional PCI signal lines are to be tested, process 100 continues with step 116.

In step 116, the HAB (e.g., HAB 12) exits the test mode so that it may be used in operations with a host computer system (e.g., computer system 28). Step 116 may also include certain maintenance steps, such as disabling power and clocking signals 16, 18, respectively, to HAB 12. HAB 12 is then free for use with host computer system 28 and peripheral device 40, for example.

FIG. 4 illustrates one functional operation of controller 50, FIG. 1; FIG. 4 is not intended to show actual signal nets through controller 50, but rather illustrates operational function. When entering the test mode, controller 50 may operate to disable communications with bus 36, FIG. 1. When this occurs, generator 55 may operate in place of host computer 28 to generate PCI signals onto PCI signal lines 48, such that HAB 12 receives and responds to operable PCI signals. Switch 54 then selects one PCI signal line 48 for output as timing signal 20, used for measurement by signal analyzer 26, for example. Switch 54 cycles through addresses within memory 52 so that each PCI signal line of interest is similarly available for test as output timing signal 20. Clock signal 18 is shown connecting to switch 54 in FIG. 4, illustrating that clock signal 18 may perturb one PCI signal line of HAB 12 so that a timing signal 20 is generated in response to clock signal 18 for that one PCI signal line. Multiple PCI signal lines may be tested in parallel as a matter of design choice, for example by simultaneous testing of multiple output timing signals 20.

Upon reading and fully comprehending this disclosure, one skilled in the art should appreciate that some certain functions of PCI test controller 14 may be performed by controller 50. For example, controller 50 may include circuitry that is functionally equivalent to signal generator 24 and timer 26. So long as HAB 12 is powered (e.g., through an external power supply 22 or through host computer system 28, if connected to HAB 12), HAB may assess its own PCI timing signals by toggling each PCI signal line 48(1 . . . N) as addressed by memory 52 and switch 54. Test results may then be reported, for example to PCI bus 36. Similarly, in another embodiment, host computer system 28 may perform certain functions of PCI test controller 14. If host computer system 28 remains connected to HAB 12 during assessment of the PCI signals, it may then supply power and clocking signals (functionally equivalent to power 16 and signal 18) to HAB 12 through connector 30. HAB 12, in turn, may then toggle each PCI signal line 48(1 . . . N) as addressed by memory 52 and switch 54; assessment of the current PCI signal line can then occur in HAB 12 or host computer 28 as a matter of design choice. Accordingly, host computer system 28 may incoporate timer 26 and, through PCI bus 36, assess timing signal 20 from HAB 12. It should therefore be apparent that assessing PCI timing signals of HAB 12 may occur in one or more ways, and even without PCI test controller 14, without departing from the scope hereof.

As noted above, it should also be appreciated that connector 60, FIG. 1, is not necessary, and that connections and control between PCI test controller 14 and HAB 12 (FIG. 1) may occur through PCI connector 30.

For example, FIG. 5 illustrates a system 10' that assesses timing of PCI signals. System 10' includes host adapter board (HAB) 12' and PCI test controller 14'. Through PCI connector 30', PCI test controller 14' supplies power 16 and clock signal 18 to HAB 12; it then measures timing signal 20 from HAB so as to assess timing of PCI signals. In FIG. 5, power supply 22 again provides power 16 to HAB 12, signal generator 24 generates clock signal 18 applied to HAB 12, and signal analyzer 26 assesses timing signal 20 so as to determine, for example, slew rate and clock-to-signal-valid delay. Connector 42 may again connect to a peripheral device 42 when HAB is in operational use.

User interface 44 connects to connector 30' through signal line 46, to initiate the test mode of HAB 12'. When HAB 12' is in the test mode, internal circuitry of HAB 12' cycles through a series of addresses to toggle PCI signal lines 48(1 . . . N) of HAB 12', to generate timing signal 20. PCI signal lines 48(1 . . . N) connect with connector 30' and include N separate signal lines corresponding to the bit-width (e.g., 128-bits) of the PCI bus (not shown). This internal circuitry of HAB 12' for example includes controller 50', with memory 52', switch 54' and generator 55'. Controller 50' is for example an integrated circuit of HAB 12', such as an I/O controller operable to facilitate communications with a peripheral device connected to connector 42. Memory 52' is for example random access memory (RAM) of controller 50', and operates to store PCI signal addresses used to toggle PCI signal lines 48(1 . . . N). Switch 54' is for example a mechanism that connects any one of PCI signal lines 48(1 . . . N) to timing signal 20, as currently addressed by the PCI addresses within memory 52'. Generator 55' is operable to generate PCI signals for HAB 12' in place of PCI control signals normally generated by a host computer system when communicating with HAB 12' over the PCI bus. In FIG. 5, therefore, no special connector is required between PCI test controller 14' and HAB 12'; rather, PCI connector 30' connects to a host computer, when HAB 12' is in operational use, and connects to PCI test controller 14, when under test.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A method of assessing timing of PCI signals, comprising:
   initiating a test mode within a host adapter board;
   generating a clock signal for the host adapter board;
   generating PCI signals within the host adapter board wherein the step of generating PCI signals uses an I/O controller of the host adapter board;
   electronically selecting one or more PCI signal lines of the host adapter board wherein the step of selecting uses an I/O controller of the host adapter board;
   assessing timing of the one or more PCI signals from the PCI signal lines to generate test results; and
   reporting the test results for verifying proper operation of the host adapter board.

2. The method of claim 1, the step of electronically selecting comprising utilizing addresses within memory of the host adapter board to select the one or more PCI signal lines.

3. The method of claim 2, further comprising storing addresses within the memory.

4. The method of claim 3, the step of storing comprising loading addresses into I/O controller memory.

5. The method of claim 1, the step of initiating a test mode comprising utilizing a jumper connected between the host adapter board and an external electronic device.

6. The method of claim 1, the step of electronically selecting comprising cycling through addresses within memory of the host adapter board.

7. The method of claim 1, the step of assessing comprising utilizing a logic analyzer.

8. The method of claim 1, the step of generating a clock signal comprising utilizing a signal generator connected with the host adapter board.

9. The method of claim 1, the step of assessing comprising assessing one or both of slew rate and clock-to-signal valid of the PCI signals.

10. A system for assessing timing of PCI signals, comprising:
    a host adapter board responsive to a test mode initialization to generate PCI signals within the host adapter board, the host adapter board having internal memory for storing addresses for PCI signal lines of the host adapter board, the host adapter board adapted to receive an external clock signal and being configured to select one or more of the PCI signal lines, based on the addresses, for output from host adapter board; and
    a PCI test controller for assessing timing of the PCI signals from the output and relative to the clock signal.

11. The system of claim 10, the PCI controller assessing one or both of clock-to-signal valid and slew rate from the output.

12. The system of claim 10, the host adapter board further comprising an I/O controller that includes the internal memory, the I/O controller operable to facilitate communications between the host adapter board and an electronic device connected with the host adapter board.

13. The system of claim 12, the controller having a switch for toggling the one or more PCI signal lines based upon the addresses.

14. The system of claim 13, the switch and memory cooperating to cycle through the addresses such that different PCI signals connect with the output, over time.

15. The system of claim 10, further comprising a generator for generating the PCI signals.

16. A system for assessing timing of PCI signals, comprising:
   means for initiating a test mode within a host adapter board;
   means for generating a clock signal for the host adapter board;
   means for generating PCI signals within the host adapter board wherein the means for generating PCI signals includes an I/O controller of the host adapter board;
   means for electronically selecting one or more PCI signal lines of the host adapter board wherein the means for electronically selecting includes an I/O controller of the host adapter board;
   means for assessing timing of the one or more PCI signals from the PCI signal lines to generate test results; and
   means for reporting the test results for verifying proper operation of the host adapter board.

17. The system of claim 16, the I/O controller further comprising internal memory for storing addresses of the one or more PCI signal lines.

18. The system of claim 17, further comprising means for cycling through the addresses such that, over time, the means for assessing assesses different PCI signals of the host adapter board.

19. The system of claim 16, the means for assessing comprising means for determining one or both of clock-to-signal valid and slew rate for the one or more PCI signal lines.

* * * * *